(12) United States Patent  (10) Patent No.: US 7,327,196 B2
Goldberg  (45) Date of Patent: Feb. 5, 2008

(54) FAST SWITCHING PHASE LOCK LOOP (PLL) DEVICE AND METHOD

(75) Inventor: Bar-Giora Goldberg, San Diego, CA (US)

(73) Assignee: Avaak Inc., San Diego, CA (US)

( * ) Notice: Subject to any disclaimer, the term of this patent is extended or adjusted under 35 U.S.C. 154(b) by 75 days.

(21) Appl. No.: 11/294,327

(22) Filed: Dec. 5, 2005

(65) Prior Publication Data

US 2006/0158263 A1  Jul. 20, 2006

Related U.S. Application Data

(60) Provisional application No. 60/632,886, filed on Dec. 3, 2004.

(51) Int. Cl.
*H03L 7/093* (2006.01)
(52) U.S. Cl. .............................. 331/16; 331/17; 331/10
(58) Field of Classification Search .................. 331/16, 331/17, 1 A, 10
See application file for complete search history.

(56) References Cited

U.S. PATENT DOCUMENTS 4,847,569 A * 7/1989 Dudziak et al. .............. 331/25
5,079,522 A * 1/1992 Owen et al. .................. 331/16
5,757,238 A * 5/1998 Ferraiolo et al. ............. 331/16

* cited by examiner

*Primary Examiner*—Joseph Chang

(57) ABSTRACT

A fast switching phase lock loop (PLL) device is provided. The PLL has a voltage controlled oscillator that generates a signal at a frequency according to a received voltage. A memory holds a set of adjustment values, with each adjustment value set to cause the VCO to pre-tune to a desired frequency. When a new frequency is required from the VCO, the PLL counters are set for the new frequency values, and the adjustment value associated with the new frequency is retrieved from memory. A voltage generator uses the adjustment value to generate a new control voltage, which pre-tunes the VCO to a frequency near the desired frequency. In this way, the VCO only needs to make minor adjustments through its loop feedback filter to lock to the new frequency. After the VCO is locked, the actual control voltage is measured and used to update the adjusted value for that frequency. In this way, the set of adjustment values are continually updated to adapt to changing environmental or circuit conditions.

21 Claims, 9 Drawing Sheets

FREQUENCY / VCO VOLTAGE TABLE

| Target VCO Freq | Last Measured Voltage | Counter Settings |
|---|---|---|
| F1 | V1 | A1, M1 |
| F2 | V2 | A2, M2 |
| F3 | V3 | A3, M3 |
| F4 | V4 | A4, M4 |
| F5 | V5 | A5, M5 |

Prior Art

Prior Art

FAST SWITCHING PHASE LOCK LOOP (PLL) DEVICE AND METHOD

RELATED APPLICATIONS

This application claims priority to U.S. provisional patent application No. 60/632,886, filed Dec. 3, 2004, and entitled "Adaptive fast switching speed PLL architecture", which is incorporated herein in its entirety.

FIELD OF THE INVENTION

The field of the present invention is phase lock loop circuits. More particularly, a phase lock loop device and method is disclosed for use in a wireless radio system.

BACKGROUND

Modern wireless technology requires cost effective, fast frequency switching Phase Lock Loop (PLL) algorithms and circuits. Switching speed is important for networking purpose and to combat the effects of multipath as can be observed in WiFi (wireless fidelity) systems. Most WiFi terminals use frequency hopping in their standard protocol; but by performing the switch, the system is burdened by the switching time overhead (the time it takes to hop from frequency F1 to F2) which can be seen as wasted resources on the channel.

Several companies and individuals have introduced various inventions or techniques to speed up PLL lock-up time, but these solutions have had limited success. Most system solutions widen the loop bandwidth for a certain period of time, to bring the Voltage Control Oscillator (VCO) close to the settling frequency. Having a wider loop accelerates the loop dynamics, but the efficiency of these types of systems is still limited.

A Phase Locked Loop is the best known and most used method to generate RF and timing signals in a communications system. A PLL makes use of a simple feedback mechanism, which allows the system to generate frequencies by changing a divider placed in the feedback path. A crystal oscillator (TCXO) is divided to a convenient frequency, Fr (reference frequency) and connected to a feedback loop. When the loop settles, then Fo=N×Fr. By changing N, a system, such as a communication system, is easily and conveniently able to change frequency. The switching speed of PLL circuits, which is defined as the time it takes to hop from frequency F1 to F2 and settle, is generally determined by the equation:

$$Tsw \sim Ln(dF/df)/wn;$$

where dF is the frequency excursion (F2−F1), df the frequency tolerance converged to (locking is a converging process so df is the frequency tolerance that is sufficient for the system to be considered in a locked state), Ln is the natural logarithm and wn the loop natural frequency.

It becomes immediately apparent that as the ratio dF/df increases, the lock time slows down. Typical values for these variables in wireless applications (e.g. WiFi applications) dF=90 MHz and df=5 KHz.

Example: for dF=90 MHz, df=5 KHz and wn=30 Krad/sec, $Tsw \approx ln(90e6/5000)/30000 \Rightarrow 320$ usec.

A large portion of this time is required to charge the loop network and bring the PLL close to a locking range, so that the circuit can converge. Further difficulties are presented since loop components change parameters with variants of time and temperature.

SUMMARY OF THE INVENTION

Briefly, a fast switching phase lock loop (PLL) device is provided. The PLL has a voltage controlled oscillator that generates a signal at a frequency according to a received voltage. A memory holds a set of adjustment values, with each adjustment value set to cause the VCO to pre-tune to a desired frequency. When a new frequency is required from the VCO, the PLL counters are set for the new frequency values, and the adjustment value associated with the new frequency is retrieved from memory. A voltage generator uses the adjustment value to generate a new control voltage, which pre-tunes the VCO to a frequency near the desired frequency. In this way, the VCO only needs to make minor adjustments through its loop feedback filter to lock to the new frequency. After the VCO is locked, the actual control voltage is measured and used to update the adjusted value for that frequency. In this way, the set of adjustment values are continually updated to adapt to changing environmental or circuit conditions.

In a specific implementation, an extended phase frequency detector (PFD) circuit is used. Although the new PFD is shown used with the fast switching PLL, it may be used in a wider range of applications. The extended PFD has circuitry for detecting when the reference signal is more than $2\pi$ out of phase with a divided VCO signal. By detecting the greater than $2\pi$ condition, the PFD may more accurately generate correction currents, and may even generate more aggressive corrections when the PLL is more than $2\pi$ out of phase.

Advantageously, the fast switching PLL enables a PLL circuit to more quickly lock to new frequencies, thereby assisting wireless devices to more effectively address multipath issues, for example. Decreased switching time also leads to more efficient use of channel resources, as well as improved communication signals. Although the fast switching PLL is highly desirable in wireless communication systems and devices, it will be appreciated that the fast switching PLL may be advantageously used in many other applications. The disclosed circuit and methods present a new way to improve switching speed of PLL circuits and specifically PLL integrated circuits (IC), by an adaptive pre-tuning of the VCO control voltage and by extending the phase detector phase measurement range.

BRIEF DESCRIPTION OF THE DRAWINGS

FIG. 2 is a frequency/voltage table for a fast switching PLL device in accordance with the present invention.

DETAILED DESCRIPTION OF THE PREFERRED EMBODIMENT

Figure 1:
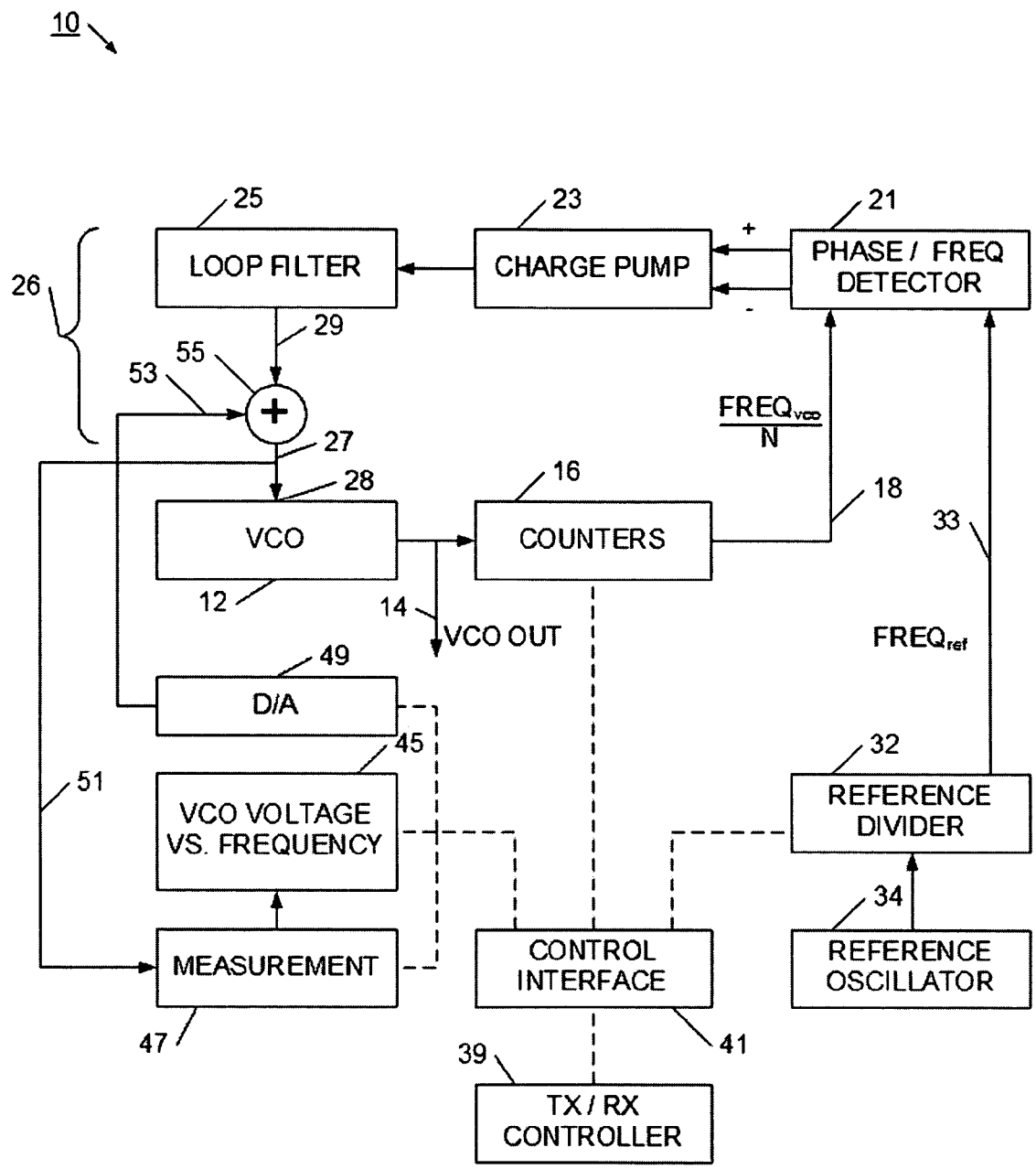
FIG. 1 is a block diagram of a fast switching PLL device in accordance with the present invention.

Referring now to FIG. 1, a fast switching phase lock loop device 10 is illustrated. Phase locked loop device 10 is constructed to more efficiently and quickly switch between frequencies as compared to known phase locked loop devices. Device 10 has a voltage controlled oscillator (VCO) that generates a frequency signal 14 responsive to a particular control voltage 27. The control voltage 27 is received at a control input port 28 for the VCO. The generated frequency signal 14 is received into a counter 16. The counter 16 is configured to divide the VCO frequency signal into a divided frequency signal 18. As is well known, the counter often has an A and an M counter to facilitate both large and more granular hops in frequency. Use of such an A-M counter allows a single reference frequency to be used as the locking signal for many different VCO frequencies. A reference signal 33 is generated by a reference oscillator 34, which may be, for example a temperature controlled crystal oscillator. In some cases, the signal from the reference oscillator 34 will also be divided by a reference divider 32. The divided VCO signal 18 and the reference frequency 33 are received into a phase-frequency detector 21. The signal from the phase frequency-detector is either a charge or discharge current signal that is proportional to the difference in phase between the divided VCO signal 18 and the reference signal 33. Depending on whether the reference signal is leading or trailing, the output from the phase-frequency detector will act to either charge or discharge the charge pump 23. The loop filter 25 generates a loop filter signal voltage 29, which is used to tune the control voltage 27 that is received by VCO 12. In this way, a feedback circuit is provided that causes the VCO to continuously tune to the frequency set according to counter 16.

Device 10 has a memory 45 for storing a table of initial VCO adjustment values for particular frequencies or frequency ranges. For example, VCO 12 may be in a device requiring particular frequencies be generated. Each of these frequencies has an associated control voltage that will set the output of the VCO to be near the desired frequency setting. Memory 45 therefore may be configured as a table of associated values, with each likely frequency setting having an associated stored control voltage. The initial settings for the control voltages may be set during manufacture, and then may be continually updated during operation of device 10. The adjustment value stored in memory 45 may be the actual control voltage used to set a particular frequency, or may be another value indicative of the required voltage.

Figure 3:
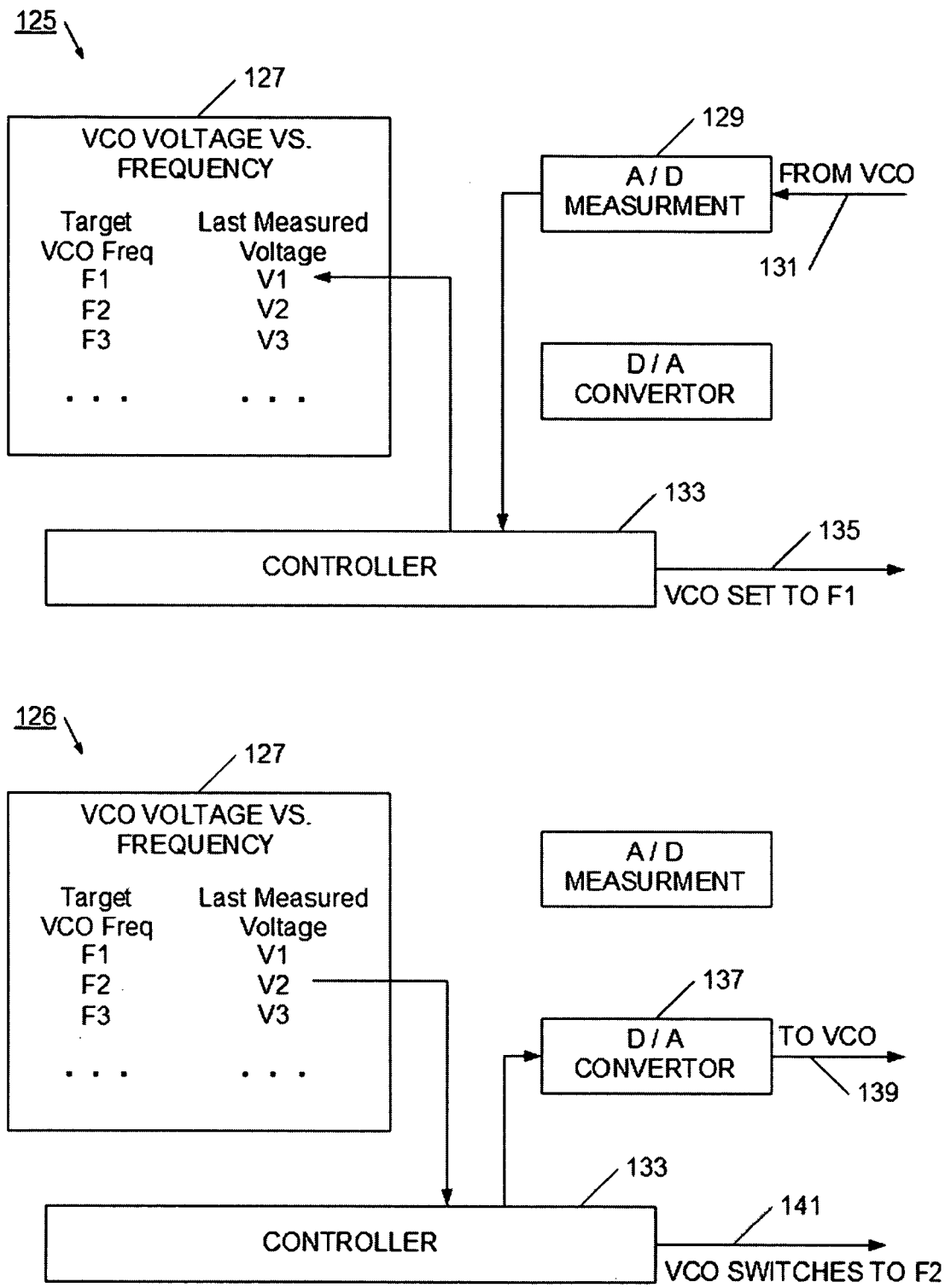
FIG. 3 is a block diagram of a fast switching PLL circuit portion in accordance with the present invention.

A voltage generator 49 is configured to receive the adjustment value from memory 45, and output an adjustment voltage 53. This adjustment voltage 53 may be combined 55 with the loop filter signal 29 to generate a new control voltage 27. In this way, the adjustment signal and the loop signal are combined to generate the current control voltage 27. In one example, the combiner 55 is a simple summing circuit. In other cases, the combining circuit may be more sophisticated. Device 10 also has a measurement circuit 47 for measuring the actual control voltage 27 at the input port 28 for VCO 12. This measurement may be done with an on board ADC (analog to digital converter), as shown in FIG. 3). In this way, the measurement circuit 47 may measure the actual voltage value causing a desired frequency to be generated by VCO 12. This actual measurement value may then be used to update the adjustment value stored in memory 45. Accordingly, the device 10 may continually adapt to VCO fluctuations caused by aging, temperature, or other circuit drift.

Device 10 has a control interface 41 for receiving instructions and communicating status information to a controller 39. In one example, controller 39 may be a transmit/receive controller for a wireless device. It will be appreciated that other types of controllers may be used. In a typical example, the device 10 is operating at a frequency set by controller 39. Controller 39 may then need to switch to a second frequency. The controller, operating through control interface 41, retrieves from memory 45 an adjustment value that has been previously stored and that is associated with the second frequency. This adjustment value is then used to cause the voltage generator 49 to generate an adjustment voltage 53, which is received into combiner circuit 55. The combiner circuit then generates a new control voltage 27, which is received by VCO 12. In this way, the control voltage 27 is immediately pre-tuned and quickly set to be close to the control voltage required for the VCO to generate the second frequency. Advantageously, the VCO is quickly brought near its locking voltage, and therefore the tuning and feedback portions operate more efficiently and quickly. It will be appreciated that various processes and algorithms may be used in defining the particular voltage applied as adjustment voltage 53.

The control interface 41 also sets counters 16 to the appropriate values for generating a divided VCO signal 18, which when in-phase with the frequency reference 33, locks to the desired second frequency. Preferably, the adjustment voltage 53 is generated at nearly the same time or concurrently with setting the counters 16. In some cases, the counters 16 may be set prior to the generation of the adjustment signal 53, and in other cases the adjustment voltage 53 may be generated prior to setting of the counters 16. It will be appreciated that the particular timing and order of setting the counters and generating the adjustment signal 53 may be set according to application specific requirements and according to the particular components used. It will be appreciated that a PLL circuit locks in ~100 usec range while changing divider ratio or changing the control voltage with a DAC are measured in nano-seconds. Therefore, for practical purposes, setting the counters and the DAC can be viewed as happening concurrently.

Phase lock loop device 10 is enabled to more effectively and quickly switch between target frequencies. Memory 45 has a set of values, with each adjustment value associated with one of the target frequencies. By using these adjustment values to initially set the control voltage, the VCO is pre-tuned to be closer to the locking range, so that the overall phase lock loop is enabled to converge and settle to the locking frequency more efficiently. In this way, the locking circuit needs only to correct for relatively small control voltage errors, and therefore is able to lock more quickly. Also, since the device 10 measures the actual control voltage at target frequencies, the memory 45 is continually updated to reflect recent operating conditions, circuit conditions, and aging conditions.

Referring now to FIG. 2, a frequency/voltage table for a fast switching PLL device is illustrated. It will be appreciated that table 100 may be stored as a single table, or that the associated values may be stored in different locations or different memories. It will also be appreciated that the table may be stored in RAM memory during use, and also may be stored to a non-volatile memory to allow stored values to be used when the device is next powered up. Alternatively, the RAM could be loaded with default values at power-up, which would then adapt during use. In one example, a frequency/VCO voltage table 102 is stored locally with the phase lock loop device. The table has a set of target VCO frequencies 104, which relate to the frequencies that the VCO is expected to generate. The target VCO frequencies may be specific frequencies that the VCO will generate, while in other cases the target VCO frequencies may relate to frequency ranges. Each of the target VCO frequencies or ranges is associated with an adjustment factor or control voltage 106. These control voltages are the last measured control voltage that caused the VCO to generate the desired VCO frequency. For example, the last time the VCO generated frequency F1, it required an input of control voltage V1. In a similar manner, the last time VCO generated frequency F2, the VCO was driven with voltage V2. It will be appreciated that the table of voltages 106 may include actual voltage measurements, or may be algorithmically processed according to processor or circuit needs. For example, the voltage values 106 may not be stored as voltage values, but may be stored as numeric values intended to drive a digital to analog converter. It will be appreciated that many adjustment algorithms may be used. It will also be understood that the voltages 106 may have default values which are used upon startup, or which may be reset according to detected conditions. In another example, the voltages 106 are continually updated according to the last measured voltage.

Each frequency, such as frequency F1, has an associated counter setting 107. Counter settings 107 are used to set a divide counter to divide the VCO signal in a way, that when locked to a reference signal, causes the VCO to generate a frequency signal locked at the desired target frequency. It will be appreciated that the counter settings 107 may be stored along with the frequency and voltage measurements, or may be stored or determined at another location.

Referring now to FIG. 3, a block diagram for a fast switching PLL circuit portion is illustrated. Circuit portion 125 shows a controller 133 which has set a VCO to operate at a frequency F1 using control line 135. Control line 35, may for example, couple to a counter which received counter settings from a controller. The VCO has been operating at frequency F1 for a period of time, so has settled to operate at frequency F1. An analog to digital measurement circuit 129 is coupled to the control voltage from VCO 131. The measurement A to D circuit 129 measures the actual value of the control voltage needed to stabilize the VCO at frequency F1, and passes that actual measurement value to controller 133. Controller 133 uses the newly measured voltage value to update the voltage stored in memory 127. More particularly, the voltage associated with frequency F1 is updated to reflect the most recent control voltage required to generate that target frequency F1. In this way, the memory 127 is continually updated to reflect the actual voltages and adjustment values required to generate the target frequencies. In most PLL circuit constructions, a "PLL Lock" indicator or signal is available. In such a case, the A to D circuit 129 may take its voltage measurement responsive to the controller receiving the PLL Lock signal.

Circuit portion 126 shows a controller 133 commanding a counter to switch to a new frequency F2 through control line 141. The controller also retrieves an adjustment value or voltage value from the stored table 127. This voltage level V2 represents the last measured voltage (or default value), which actually caused the VCO to operate at frequency F2. The controller uses the retrieved value V2 to generate a signal at voltage generator 137, which may be a D to A converter, to generate an adjustment voltage 139 to send to the VCO. In this way, the VCO is quickly and efficiently pre-tuned to a value known to have last set the VCO to F2. By pretuning the VCO to a known initial voltage value, the overall locking circuit is able to lock and settle more quickly. Ideally, the active circuit correction voltage 29, will change only slightly when switching from F1 to a new frequency F2.

Figure 4:
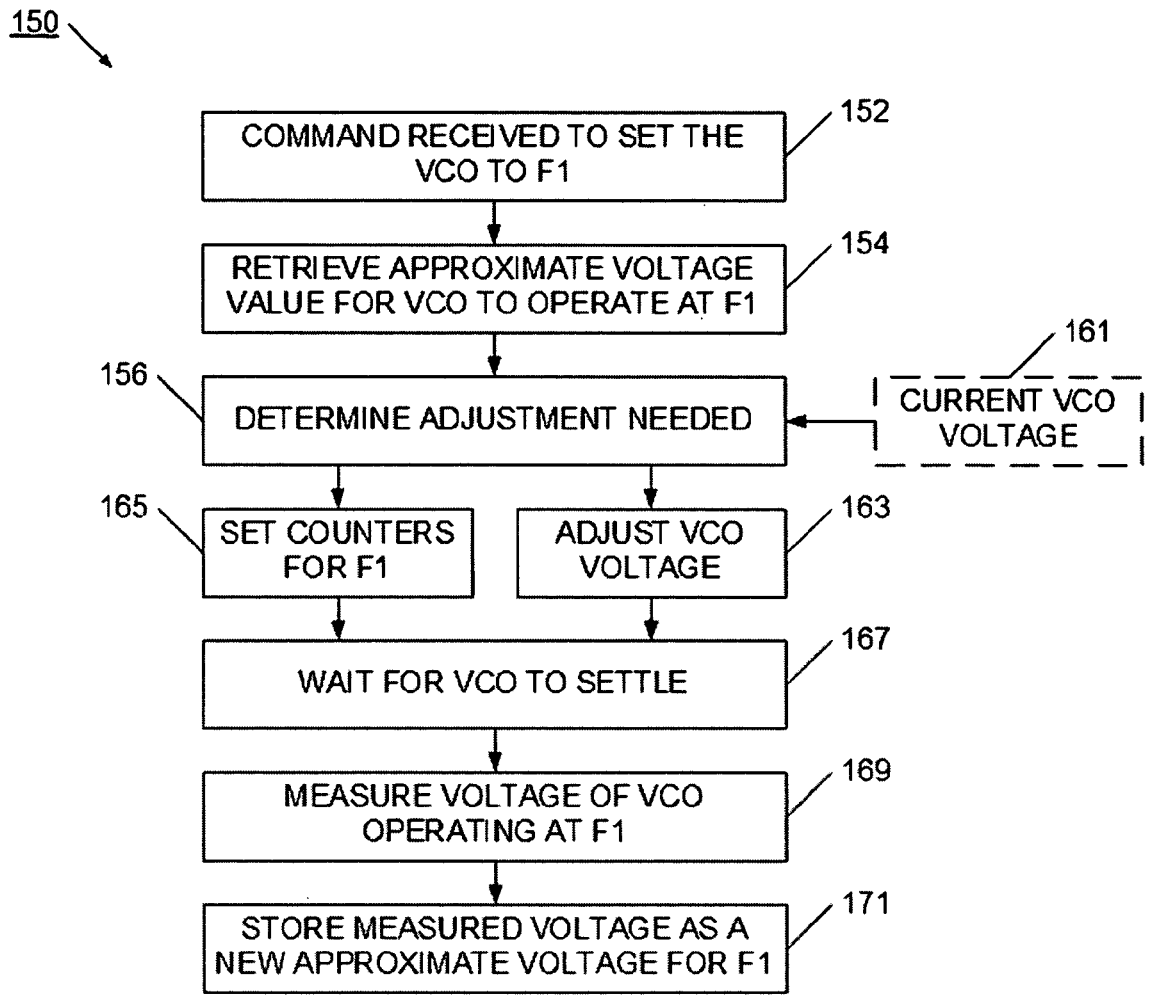
FIG. 4 is a flowchart of a method of switching a PLL device in accordance with the present invention

Referring now to FIG. 4, a flow chart of a method 150 for switching a phase lock loop device is illustrated. Method 150 receives a command to set the VCO to a frequency F1 as illustrated in block 152. An adjustment value is retrieved from a local memory. The adjustment value may be the approximate voltage value required to operate the VCO at frequency F1 as shown block 154. This met value may have been pre-stored during manufacture, or more preferably, is updated continually according to actual voltages measured during the last operation at frequency F1. The method 150 determines if an adjustment is needed to the retrieved value. For example, the current VCO voltage 161 may affect the level of adjustment, or a temperature input may also be used to adjust the value. In changing to the new frequency, two operations occur currently, or at about the same time: 1) new counter values are set as shown in block 65; and 2) the VCO control voltage is adjusted according to the retrieved adjustment value, as shown in block 163. The setting of counters and the adjustment of the VCO voltage are preferably done at nearly the same time or concurrently, although the order and timing may be adjusted according to application specific requirements and specific components used. After the counters have been set and the VCO has been pretuned to its initial value, the VCO quickly settles to its locked voltage as shown in block 167. The control voltage required to generate frequency F1 may then be measured as shown in block 169. The new measured value is then stored as the new approximate voltage value for F1 as shown in block 171. In this way, the stored adjustment values are continually updated to reflect current circuit conditions.

Figure 5:
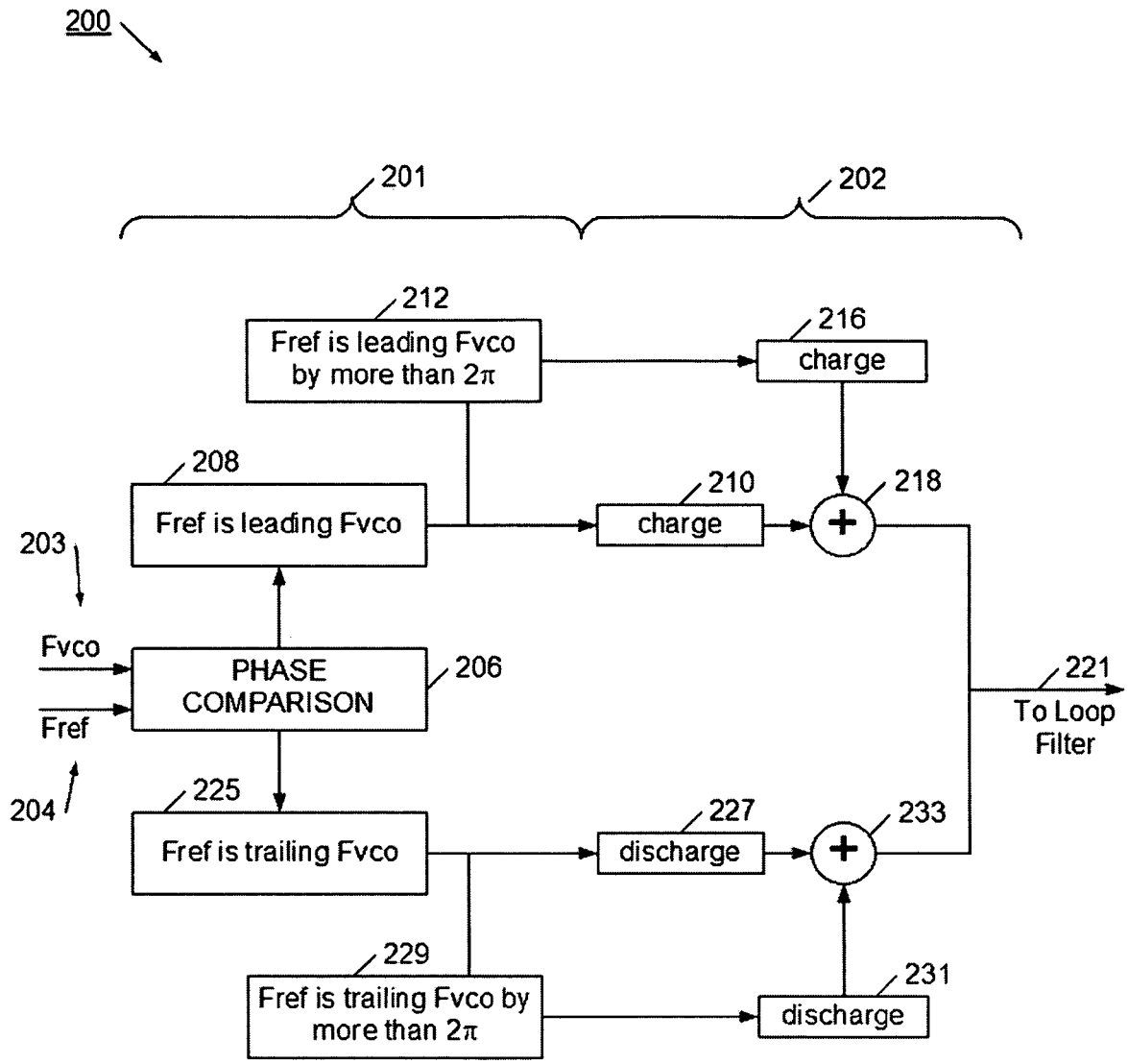
FIG. 5 is a block diagram of a phase/frequency detector in accordance with the present invention.
Figure 8:
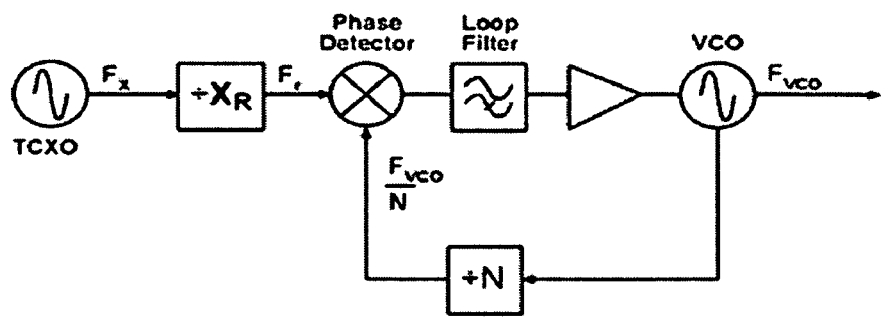
FIG. 8 is a block diagram of a prior art PLL device and phase/frequency detector.
Figure 8:
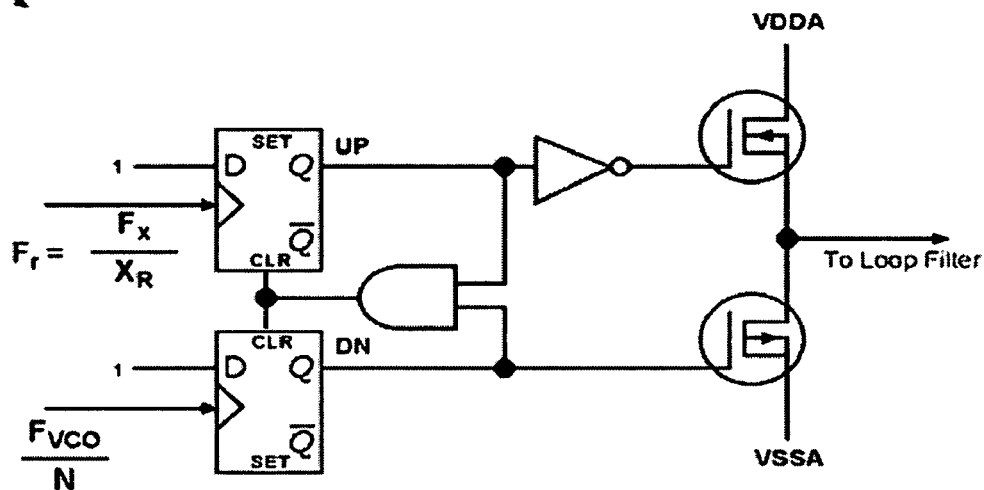
Figure 8:
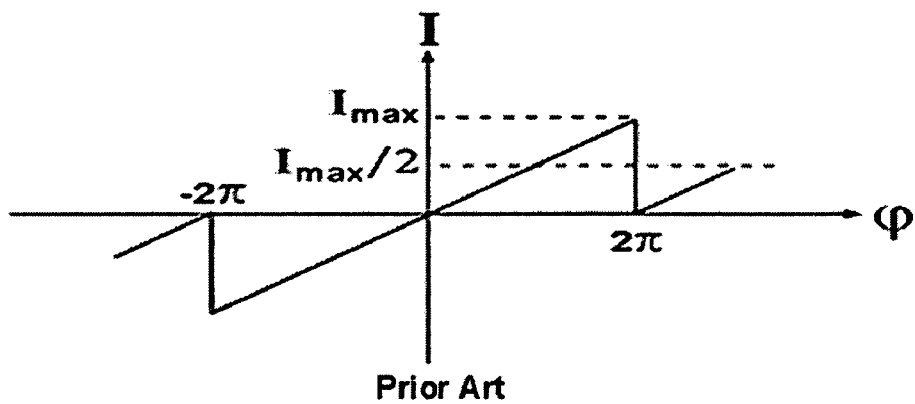

Referring now to FIG. 5, a block diagram 200 for a phase-frequency detector is illustrated. In one example, the phase-frequency detector 200 may be used as a phase-frequency detector in a fast switching PLL device such as PLL device 10 illustrated with reference to FIG. 1. However, it will be appreciated that the phase-frequency detector 200 may be used in other devices and for other applications. Phase-frequency detector 200 has an increased detection span to enable appropriate response to greater phase or frequency differences between a reference signal and a divided VCO signal. Typically, known phase frequency detectors operate in a detection span of plus or minus $2\pi$. Phase-frequency detector 200 extends this detection span to greater than $2\pi$, for example to $4\pi$ or 6pi. In this way, large initial phase or frequency errors may be more quickly and efficiently corrected. This wider detection span is particularly useful for a fast switching PLL device, such as device 10 illustrated with reference to FIG. 1. For example, when the controller in FIG. 1 sets a new counter value and nearly simultaneously causes a substantial change in the VCO control voltage, the initial error between the reference signal and the divided VCO signal is random. This random initial error is unlike a known PLL circuit that starts from a lock state, phase 0. Here, the application of the pretuning voltage moves the VCO to a new random phase). Further, in a known PLL circuit, an error above $+/-2\pi$ is incorrectly interpreted as a small error as the circuit is operating modulus $2\pi$ and even if the phase error is $>2\pi$, the circuit will interpret it as small. FIG. 8, graph C, shows that known PDF phase measurements incorrectly identify errors above $2\pi$, and therefore cannot efficiently correct for these larger error conditions.

However, the phase error can often reach $4\pi$, and may even reach $6\pi$ or more in some cases. However, it has been found that extending the detection span to $4\pi$ captures and more efficiently corrects most initial error conditions. For example, FIG. 7, graph 290 shows a simulated phase error (in $\pi$ radians) for a PLL circuit where the reference frequency is relatively high (5 MHz) and the VCO divide count is relatively low (250). In this case, an initial phase error over $-3\pi$ is seen, and then moves to well over $+3\pi$ before settling. Thus, depending on circuit configurations, a PLL circuit may be subject to errors in excess of $2\pi$. Although phase frequency detector 200 increases the efficiency of device numeral 10, it will be appreciated that a more standard phase frequency detector may be used for device 10.

Phase frequency detector 200 receives a divided VCO signal 203 and a reference signal 204 into a phase comparison circuit 206. The phase comparison circuit 206 may differentiate if the reference signal is leading or trailing the divided VCO signal. In the case where the reference signal is leading the divided VCO signal 208, the circuit uses a current source 210 to generate an electrical charge. Additional detection span circuitry 212 is able to detect when the reference frequency leads the VCO divided signal by more than $2\pi$. In such a case, an additional charging circuit 216 is activated to provide additional charge to cause a more aggressive change in the VCO tuning. The charges 210 and 216 may be summed together or otherwise combined as shown in block 218, and the output current signal is passed to a loop filter as shown in block 221. The loop filter then uses the received signal to generate a voltage control signal for the voltage controlled oscillator. For example, the loop filter may use the received current signal to charge or discharge capacitors, and use the voltage across the capacitors as the loop filter voltage. Since charge circuit 216 is not activated until there is at least a $2\pi$ difference between signals, the charge circuit 216 may apply a more aggressive change in current as compared to charge circuit 210. Additionally, charge circuit 210 may act erratically in a condition with more than $2\pi$ difference, especially with an error at or near $2\pi$, thereby causing additional delay as the circuit compensates. Accordingly, charge 216 also provides a more consistent and logically correct response in the case when frequency error is $2\pi$ or more.

When the frequency reference signal is trailing the VCO signal as shown in block 225, a discharge circuit 227 is used to bring the signals together. In the case where more than $2\pi$ of error exists between the signals, the additional detection span circuitry 229 detects the additional error and causes the additional discharge circuit 231 to activate. Discharge circuit 231 may more consistently apply its current control in the case when error is more than $2\pi$, and because the frequency error is so large, may more aggressively adjust current. The discharge impact of circuits 227 and 231 are added or otherwise combined in combiner 233, and the resulting signal is passed to the loop filter circuit 221 as discussed above. In this way, the phase-frequency detector 200 has a phase-frequency detection component 201, as well as an impact to the structure of the charge pump 202.

Figure 6:
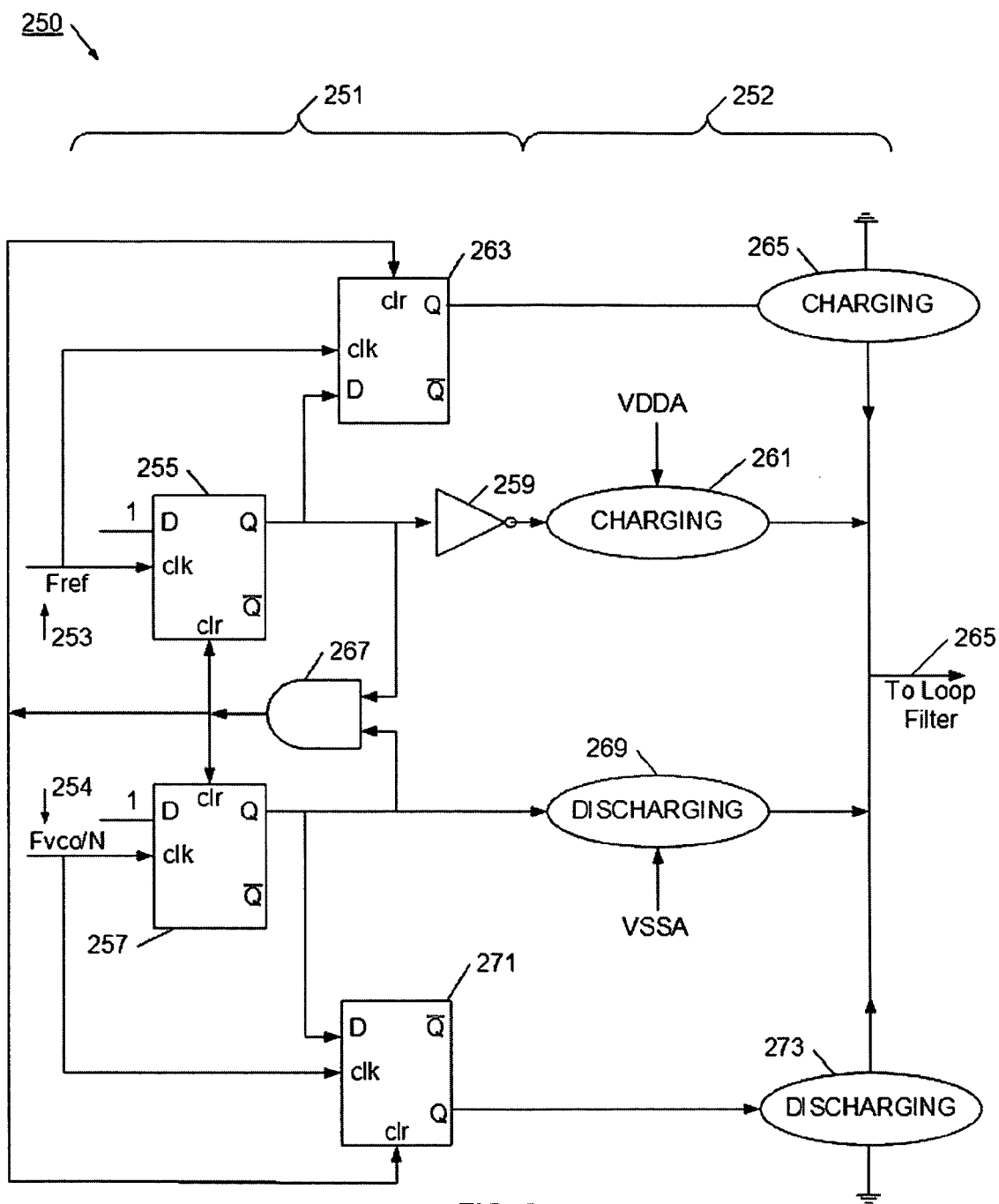
FIG. 6 is a block diagram of a phase/frequency detector in accordance with the present invention.

Referring now to FIG. 6, a specific implementation for the phase frequency detector is illustrated. Phase frequency detector 250 has a phase-frequency detector portion 251 as well as a charge pump section 252. Phase-frequency detector 250 is constructed to detect detection spans out to plus/minus $4\pi$. However, it will be appreciated that additional circuitry may be added to extend to plus/minus $6\pi$ of error or beyond. The phase-frequency detection circuit portion 251 receives a reference signal 253 as well as a divided VCO signal 254. The reference signal is received into the clock input for flip-flop 255, and the divided VCO signal is received into the clock input for flip-flop 257. Since the D input for both flip-flops is maintained high, the Q output will follow the rising edge out of the signal received at the clock. The Q outputs for the flip-flops are also inputs to an "AND" gate 267, which is connected to the "clear" inputs for flip-flops 255, 257, 263, and 271. Accordingly, in the case where the reference signal leads the divided VCO signal, the Q output of flip-flop 255 will go high to drive inverter 259 and charging circuit 261, and when the divided VCO circuit is received at flip-flop 254, the AND gate 267 will cause flip-flops 255, 257, 263, and 271 to reset. In this way, charging circuit 261 is activated from the time the reference signal was received to the time the divided VCO signal was received. In a similar manner, if the divided circuit 254 is leading the reference signal 253, the Q output for flip-flop 257 will go high and drive the discharging circuit 269 until the reference signal 253 has caused the AND circuit 267 to reset the flip-flops.

As described thus far, the phase detection circuit 250 detects and corrects for errors up to plus/minus $2\pi$. However, phase-frequency detector 250 adds extension circuitry to enable detection up to plus/minus $4\pi$ of error. For example, the Q output from flip-flop 255 is connected to the D input for flip-flop 263. In this way, when the reference signal is leading the divided VCO signal, and the Q of flip-flop 255 has gone high, the charging circuitry 259/261 is activated normally. Also, since the D input is also high, the flip-flop 263 is now in a condition to detect another rising edge on the frequency reference signal. Accordingly, if a second rising edge for the reference signal 253 is detected prior to the detection of the rising edge on the divided VCO frequency signal 254, the clock input of 263 is enabled. According, the Q output from flip-flop 263 is turned high, thereby activating charging circuit 265. Since the activation of charging circuit 265 indicates that more than $2\pi$ of error exists, charging circuit 265 may more aggressively adjust current to the loop filter. In a similar manner, flip-flop 271 is able to detect when a second rising edge for divided VCO signal 254 is received prior to receiving a first rising edge for reference signal 253. In this way, the extension circuitry, including flip-flop 271, enables the detection of up to $4\pi$ of error. When detection of more than $2\pi$ is detected, the Q signal of the flop 271 is turned high, thereby activating the discharging circuit 273. Since discharging circuit 273 is only activated when more than $2\pi$ of error is detected, discharging circuit 273 may more aggressively affect current flow to the loop filter 265.

Figure 7:
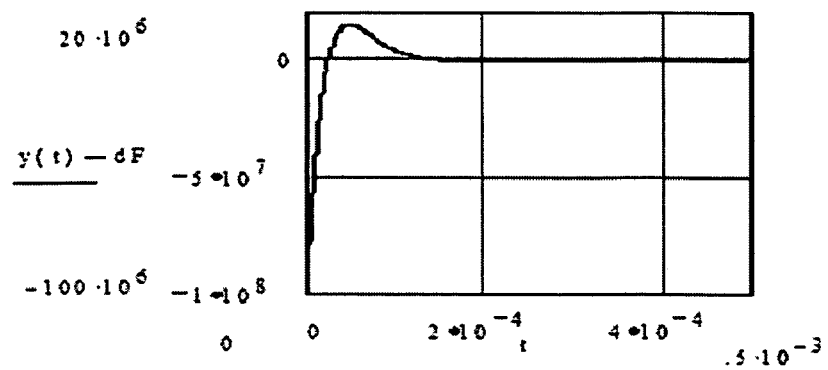
FIG. 7 has graphical illustrations of timing results for switching a PLL device.
Figure 7:
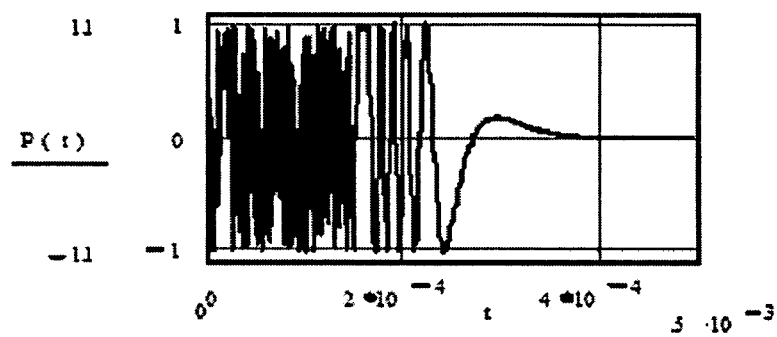
Figure 7:
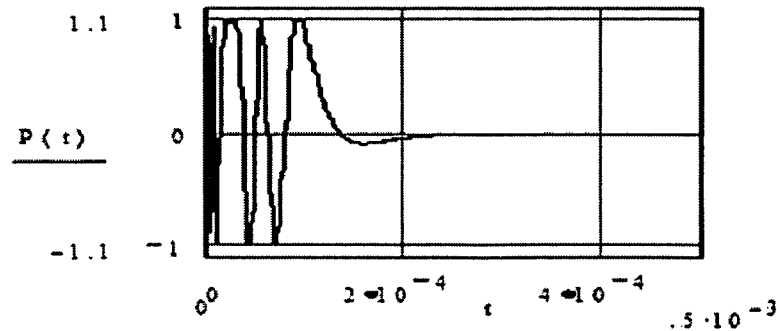
Figure 7:
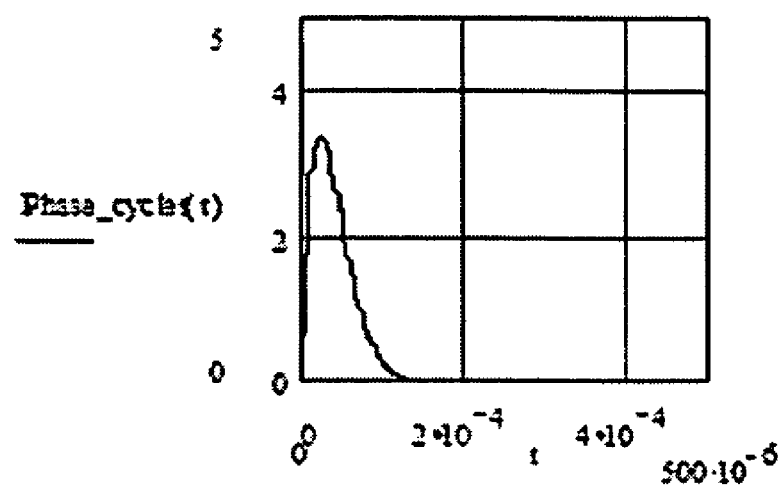

Referring now to FIG. 7, several graphs illustrative of simulated results are shown. Simulations were performed for a 2500 MHz synthesizer in the WiFi range (wn=20 Krad/sec.). Graph 275 shows frequency error versus time for a 90 Mhz transient using a known PLL circuit. Graph 280 shows a more detailed phase transient in a known PLL circuit, where the y axis shows the frequency error in $\pi$ radians. Graph 285 shows detailed phase transition of the fast-switching PLL circuit, with about a 100:1 improvement due to pre-tuning the VCO control voltage.

Generally, the proposed fast switching PLL incorporates an additional circuit as compared to the known PLL circuit. This new circuit measures the control voltage for each frequency in locked state, stores that value, and then pre-tunes the circuit to the necessary voltage when hopping to a new frequency, thus saving most of transient time used when switching. This way the process is self-learning and adapts itself to tolerances (or aging/temperature variations) in control parameters. One implementation is to place an Analog to Digital Converter (A/D) to measure the control voltage generating a particular frequency, and store the associated digital value in a RAM or other memory. When that frequency is commanded next time, the stored value is retrieved from RAM and a D/A generates an accurate initial control voltage, which pre-tunes the VCO so that only a slight transient happens. The circuit is adapting, so changes in pre-tuning caused by temperature changes or aging will be self correcting. Initially, on power up, the additional circuitry may scan all frequencies and store each pre-tuning voltage in memory. The available frequencies may be, for example, all channel frequencies that a mobile device is likely to use in securing and using its air interface. Thereafter, in normal operation, the pre-tune voltages are continually updated (as temperature and aging change characteristics). This way pre-tune voltages stored in the RAM will be updated. Since the process is self-adjusting, it can be applied to large production runs where issues of tolerances of VCO control voltage and other variable parameters is most evident and can be self-correcting with this invention. The additional components may include, for example, :an A/D (~8-10 bits), a Digital to Analog Converter (D/A) (~8-10 bits), RAM, and a simple control mechanism, or a shared controller.

Ideally, when switching from frequency to frequency, there is no change in voltage at the charge pump in transient. The final accuracy of the A/D-D/A system is the transient which is in the order of the quantization errors of the A/D and D/A devices used. For an 8 bit system, with 1V peak to peak coverage of the desired frequency range (say 2400-2500 MHz) the error will be in the order of 4 mV which can translate to ~500 KHz. If a 10 bit A/D D/A devices are used then the error is in the order of 1 mV with a corresponding frequency error of ~100 KHz.

As described above the extended range frequency-phase detector increases the detection span from the standard +/−2π to +/−4π or even 6π. This way, the phase detector is always in the linear region and its "saw tooth" characteristic ("C" in FIG. 8) which slows the switching time by 2:1 (charge pump duty cycle) is eliminated.

The device and method presented has shown the ability to expedite lock up time in PLL circuits by adaptive measurement and pre-tuning of the VCO control voltage to its settling value. In addition, a modification of the PFD was suggested to increase the phase error measurement in a transient stage and indicate the presence of a large error. This error can be corrected by increasing the pump current from secondary current sources. It is estimated, that the total additional real estate (die size) to implement this new circuit on a standard PLL chip (either Integer N or fractional N devices) is minimal—only adding in some constructions about 10% to the overall size of the circuit in some cases. This means that the fast PLL circuit is not only functionally very attractive, but that it also practical to implement.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A phase lock loop device, comprising:
   a voltage controlled oscillator generating a first VCO signal at a first frequency responsive to a first control voltage;
   a memory holding a set of adjustment values, with each adjustment value having an associated frequency value;
   a controller coupled to the memoryalkis and configured to select an adjustment value associated with a second frequency;
   a voltage generator configured to generate an adjustment signal using the selected adjustment value;
   a loop filter circuit connected to the voltage generator and to the voltage controlled oscillator, the loop filter circuit configured to generate a second control voltage using: 1) the adjustment signal and 2) a signal indicative of a phase difference between a reference signal and a divided VCO signal; and wherein the controller is coupled to a divider circuit, and the controller signals the divider circuit to change its divide ratio to implement the second frequency;
   a measurement circuit connected to the voltage controlled oscillator at a point that allows the measurement circuit to measure the voltage of the first control voltage; and
   wherein the memory is updated to have an updated adjustment value associated with the first frequency.

2. The phase lock loop device according to claim 1, further wherein the voltage generator is a digital to analog converter.

3. The phase lock loop device according to claim 1, further including a phase-frequency detector and charge pump connected to the loop filter, the phase-frequency detector and charge pump generating the signal indicative of the phase difference between the reference signal and the divided VCO signal.

4. The phase lock loop device according to claim 3, wherein the phase-frequency detector has a first current source circuit acting responsive to a greater than |2π| difference in phase between the reference signal and the divided VCO signal.

5. The phase lock loop device according to claim 4, wherein the phase-frequency detector has a second current source circuit acting responsive to a less than |2π| difference in phase between the reference signal and the divided VCO signal.

6. The phase lock loop device according to claim 5, wherein the magnitude of current change is equal or greater for the first current source as compared to the second current source.

7. A method of phase locking, comprising the steps of:
   operating a voltage controlled oscillator (VCO) at a first frequency, the VCO receiving a first control voltage at an input port;
   receiving a switch instruction to switch the VCO from the first frequency to a second frequency;
   retrieving, responsive to the switch instruction, a second adjustment value that is associated with the second frequency;
   generating a second control voltage using the second adjustment value;
   applying the second control voltage to the VCO input port;
   setting, responsive to the switch instruction, a divide counter to counter settings associated with the second frequency, the counter generating a divided VCO signal; and tuning the second control voltage using a loop filter signal, the loop filter signal being indicative of a phase difference between a reference signal and the divided VCO signal;

measuring the voltage value of the first control voltage; and storing a first adjustment value associated with the first frequency, the first adjustment value being indicative of the voltage value.

8. The method according to claim 7, wherein the generating step includes processing the second adjustment value using a digital to analog converter.

9. The method according to claim 7, wherein the measuring and storing steps are performed each time the VCO is switched and settles to the first voltage.

10. The method according to claim 7, further including the steps of:

receiving a PLL lock indicator;

measuring the voltage value of the second control voltage; and updating the second adjustment value associated with the first frequency, the updated second adjustment value being indicative of the voltage value.

11. The method according to claim 7, further including the steps of:

waiting for the tuning step to settle so that the reference signal and the divided VCO signal are substantially locked;

measuring the voltage value of the second control voltage; and updating the second adjustment value associated with the first frequency, the updated second adjustment value being indicative of the voltage value.

12. The method according to claim 7, further including the steps of:

detecting a large phase difference greater than $2\pi$ between the reference signal and the divided VCO signal; and generating, responsive to detecting the large phase difference, a similar or more aggressive adjustment to the loop filter signal.

13. The method according to claim 12, further including the steps of:

detecting a small phase difference less than $2\pi$ between the reference signal and the divided VCO signal; and generating, responsive to detecting the small phase difference, an adjustment to the loop filter signal.

14. The method according to claim 13, wherein the more aggressive adjustment and the adjustment value are combined when the large phase difference is detected.

15. A method of operating a phase lock loop, comprising:

maintaining a table of associated adjustment values and frequency values;

instructing a voltage controlled oscillator (VCO) to switch to a new frequency, the new frequency value being related to one of the values stored in the table;

retrieving from the table the adjustment value that is associated with the new frequency value;

using the retrieved adjustment value to set a new control voltage for the VCO; and tuning the control voltage to a settled control voltage, the settled control voltage substantially locking a divided VCO signal to a reference signal;

measuring the settled control voltage; and updating the adjustment value for the new frequency according to the measured value.

16. The method according to claim 15, wherein the instructing step is performed before the retrieving step.

17. The method according to claim 15, wherein the retrieving step is performed before the instructing step.

18. The method according to claim 15, wherein the instructing step and the retrieving step are performed nearly concurrently.

19. The method according to claim 15, wherein an adjustment value is associated with a frequency range.

20. The method according to claim 15, wherein the instruction step includes the step of setting counter values in a counter.

21. The method according to claim 15, wherein the tuning step further includes the steps of:

detecting a large phase difference greater than $2\pi$ between the reference signal and the divided VCO signal; and applying, responsive to detecting the large phase difference, a more aggressive tuning of the control voltage.

* * * * *